(12) United States Patent
Kang et al.

(10) Patent No.: US 11,764,076 B2
(45) Date of Patent: Sep. 19, 2023

(54) SEMI-EMBEDDED TRACE STRUCTURE WITH PARTIALLY BURIED TRACES

(71) Applicant: QUALCOMM Incorporated, San Diego, CA (US)

(72) Inventors: Kuiwon Kang, San Diego, CA (US); Joan Rey Villarba Buot, Escondido, CA (US); Terence Cheung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 18 days.

(21) Appl. No.: 17/107,512

(22) Filed: Nov. 30, 2020

(65) Prior Publication Data

US 2022/0172963 A1 Jun. 2, 2022

(51) Int. Cl.
*H01L 21/48* (2006.01)
*H01L 23/498* (2006.01)
*H01L 23/00* (2006.01)

(52) U.S. Cl.
CPC ........ *H01L 21/4857* (2013.01); *H01L 21/481* (2013.01); *H01L 23/49822* (2013.01); *H01L 23/49838* (2013.01); *H01L 24/16* (2013.01); *H01L 2224/16227* (2013.01); *H01L 2224/16238* (2013.01)

(58) Field of Classification Search
None
See application file for complete search history.

(56) References Cited

U.S. PATENT DOCUMENTS

| | | | |
|---|---|---|---|
| 2006/0012048 A1* | 1/2006 | Murai | H05K 3/4682 257/E23.173 |
| 2014/0084475 A1* | 3/2014 | Chen | H01L 21/4853 257/773 |
| 2015/0366064 A1* | 12/2015 | Hsu | H05K 1/181 29/842 |
| 2020/0051907 A1 | 2/2020 | Kang et al. | |

* cited by examiner

*Primary Examiner* — Hung K Vu
(74) *Attorney, Agent, or Firm* — Patterson + Sheridan, LLP

(57) ABSTRACT

Certain aspects of the present disclosure generally relate to an embedded trace substrate with partially buried traces, methods for fabrication thereof, and apparatus comprising such an embedded trace substrate. One example method of fabricating an embedded trace substrate generally includes creating a pattern of conductive traces above a dielectric layer and mechanically pressing on the pattern of conductive traces such that lower portions of the conductive traces are buried in the dielectric layer.

20 Claims, 6 Drawing Sheets

SEMI-EMBEDDED TRACE STRUCTURE WITH PARTIALLY BURIED TRACES

BACKGROUND

Field of the Disclosure

Certain aspects of the present disclosure generally relate to electronic components and, more particularly, to semi-embedded trace structures with partially buried traces.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices. To form a packaged assembly, one or more IC dies may be coupled to a rigid substrate or to a flexible substrate, such as an embedded trace substrate (ETS).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include reduction in conductive pattern peeling (e.g., trace, conductive pad, or other conductive element peeling) from a package substrate, such as an embedded trace substrate.

Certain aspects of the present disclosure provide a method of fabricating an embedded trace substrate. The method generally includes creating a pattern of conductive traces above a dielectric layer and mechanically pressing on the pattern of conductive traces such that lower portions of the conductive traces are buried in the dielectric layer.

Certain aspects of the present disclosure provide an embedded trace substrate. The embedded trace substrate generally includes a first dielectric layer and a pattern of conductive traces disposed above the first dielectric layer, wherein lower portions of the conductive traces are buried in the first dielectric layer and wherein upper portions of the conductive traces are exposed above the first dielectric layer.

Certain aspects of the present disclosure provide a packaged assembly. The packaged assembly comprises an embedded trace substrate and an integrated circuit die disposed above the embedded trace substrate. The embedded trace substrate generally includes a dielectric layer and a pattern of conductive traces disposed above the dielectric layer, wherein lower portions of the conductive traces are buried in the dielectric layer and wherein upper portions of the conductive traces are exposed above the dielectric layer. The integrated circuit die has one or more conductive terminals coupled to the upper portions of the conductive traces.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to semi-embedded trace structures having a pattern of conductive elements that are partially buried.

Figure 1:
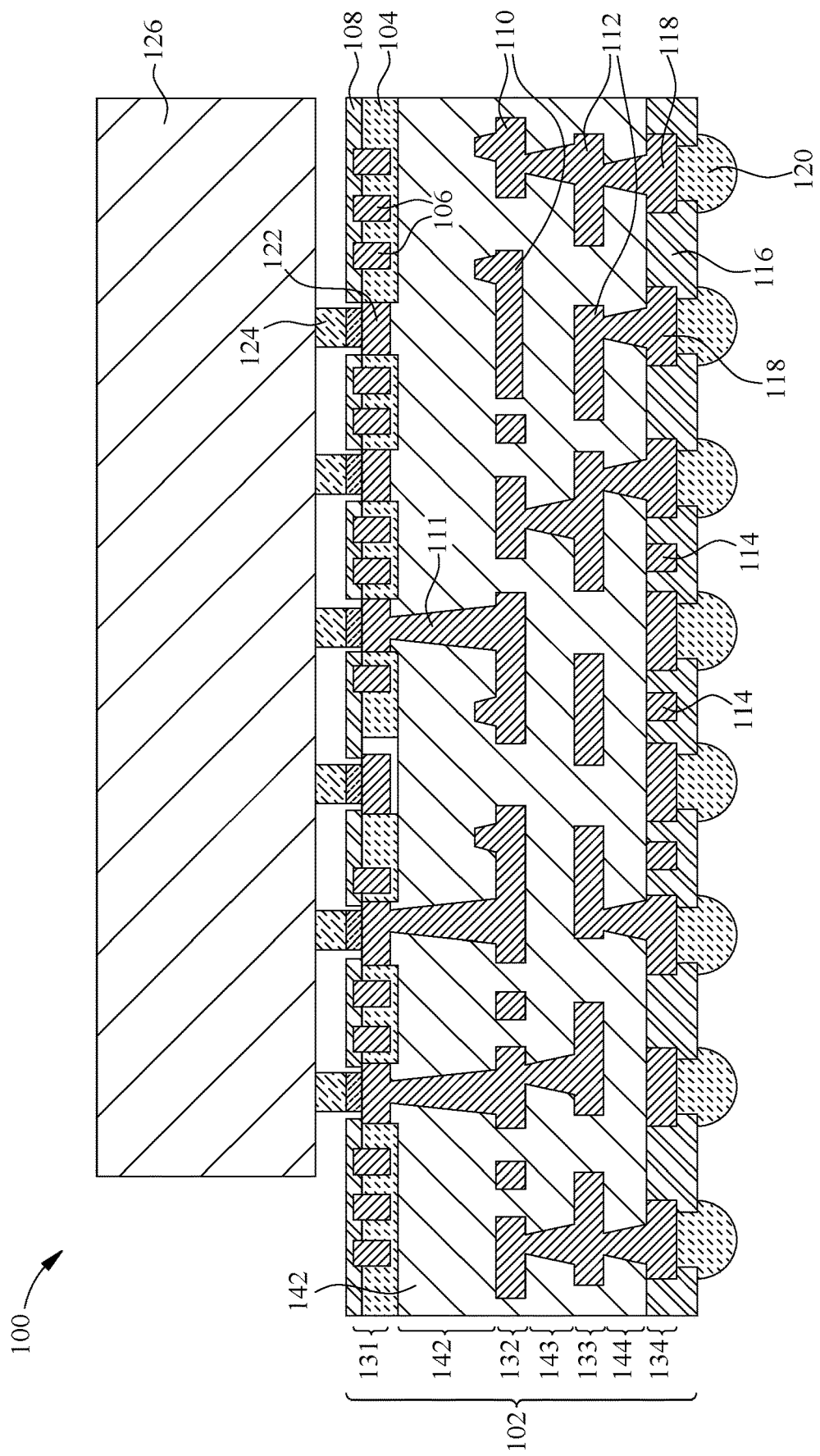
FIG. 1 is a cross-sectional view of an example chip package, in accordance with certain aspects of the present disclosure.

FIG. 1 illustrates a cross-sectional view of an example chip package 100 (also referred to as a "packaged assembly"), in accordance with certain aspects of the present disclosure. As shown, the chip package 100 includes a substrate 102 and an integrated circuit (IC) die 126 disposed above and coupled to the substrate 102.

The chip package 100 may be implemented as a chip scale package, such as a wafer level chip scale package having a package size that is near the die size. For certain aspects, a chip scale package may have package size that is <1.2 times the size of the die and surface mountable. The chip package 100 may be used to package various electronic circuits, such as a system-on-a-chip (SoC), a modem, a radio frequency front-end (RFFE) circuit, memory, a general purpose processor, a digital signal processor (DSP), an image processor, a graphics processing unit (GPU), a central processing unit (CPU), an application specific integrated circuit (ASIC), a field programmable gate array (FPGA) or other programmable logic device (PLD), discrete gate or transistor logic, discrete hardware components, or any combination thereof. The IC die 126 may represent one or more of these or other electronic circuits.

In certain aspects, the substrate 102 may be a coreless embedded trace substrate (ETS), which may include a plurality of metal layers and one or more dielectric layers disposed between each adjacent pair of metal layers. For example, the dielectric layer(s) may be composed of a pre-impregnated (PPG) dielectric material. Each of the metal layers may include a pattern of conductive elements, such as traces, pads, and/or other shapes. As illustrated in FIG. 1, the substrate 102 has four metal layers 131-134 and three dielectric layers 142-144, but the reader is to understand that the substrate may include more or less than four metal layers and more or less than three dielectric layers. For example, the substrate 102 may include a first metal (M1) layer 131, a second metal (M2) layer 132, a third metal (M3) layer 133, and a fourth metal (M4) layer 134. As shown, the M1 layer 131 may be the topmost layer and include a plurality of traces 106. Furthermore, the M2 layer 132 may be disposed below the M1 layer 131 and include a plurality of traces 110. Furthermore, the M3 layer 133 may be disposed below the M2 layer 132 and include a plurality of traces 112. Furthermore, the M4 layer 134 may be disposed below the M3 layer 133 and include a plurality of traces 114. The substrate 102 may have conductive pads 122 on its upper surface for coupling to the IC die with conductive pillars 124 (e.g., copper (Cu) pillars), bumps, or other suitable structures. The substrate 102 may also include vias 111 for connecting the conductive elements of adjacent metal layers (e.g., a trace 106 in the M1 layer 131 to a trace 110 in the M2 layer 132).

In certain aspects, the substrate 102 may include a primer layer 104, as shown in FIG. 1. A primer layer may be disposed adjacent to one or more of the dielectric layers that compose the substrate 102, such as the topmost dielectric layer 142 and/or the bottommost dielectric layer 144. The traces 106 may be disposed partially within the primer layer 104. In other aspects, there may be no primer layer 104. In this case, the pattern of traces 106 may be partially embedded in a material of the substrate 102, such as in the topmost dielectric layer 142. The primer layer 104 may be a continuous layer with holes at various locations exposing the conductive pads 122.

Layers of solder resist 108 and 116 may be applied to the upper and lower surfaces of the substrate 102, as shown. For example, a top layer of solder resist 108 may be arranged above the topmost metal layer to cover the traces in the conductive pattern (e.g., the M1 layer 131 to cover the traces 106). The top layer of solder resist 108 may have one or more trenches for exposing the conductive pads 122. In certain aspects, a bottom layer of solder resist 116 may be arranged below the bottommost metal layer to cover the traces in the conductive pattern (e.g., the M4 layer 134 to cover the traces 114). The bottom layer of solder resist 116 may also have trenches for exposing conductive pads 118 (e.g., under-bump metallization) in the bottommost layer for coupling to an electronic component via solder balls 120.

Traces disposed on a surface of an embedded trace substrate may experience peeling from the substrate. In other words, the traces may peel away from the substrate and may become disconnected, causing an open circuit.

Example Semi-Embedded Trace Structures

Certain aspects of the present disclosure generally relate to semi-embedded trace structures having a pattern of conductive elements (e.g., traces) that are partially buried in a substrate (e.g., an embedded trace substrate), which may enable a more secure attachment of the conductive elements to the substrate. Having such partially buried conductive elements may lead to improved reliability of the traces (and other conductive elements) in the structure. In particular, the more secure attachment of conductive elements may allow handheld and other portable devices to pass drop tests more easily, since the traces may not peel off from the substrate within a packaged assembly incorporated in the device. Accordingly, certain aspects of the present disclosure relate to mechanically pressing traces (and other conductive elements) into a dielectric layer to reduce the probability of the traces peeling.

Aspects of the present disclosure may be applicable to package assemblies, such as processors, memory, and/or power management dies in high lead count ball grid array (BGA) packages used in handheld devices or tablets, where fine ball pitches may be utilized. In particular, aspects of the present disclosure may be used for both wire-bond (WB) and flip chip (FC) BGA packages and for packages of one or more dies (including stacks of dies).

Figure 2A:
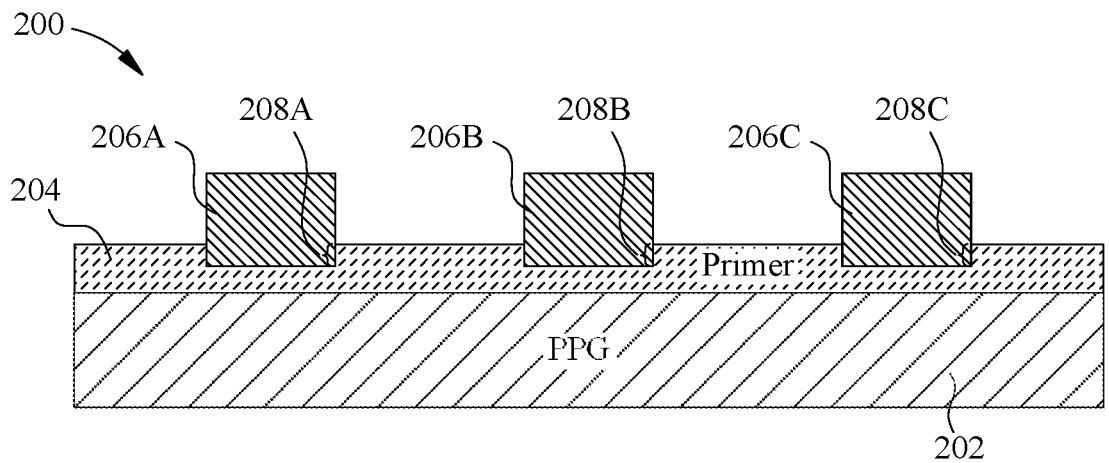
FIGS. 2A and 2B depict various views of example embedded trace substrates with partially buried traces and a primer layer, in accordance with certain aspects of the present disclosure.

FIG. 2A depicts a cross-sectional view of an example embedded trace substrate 200, in accordance with certain aspects of the present disclosure. In certain aspects, the embedded trace substrate 200 may include a dielectric layer 202. The dielectric layer 202 may comprise a dielectric material, such as pre-impregnated composite fibers, also referred to as prepreg or PPG. The embedded trace substrate 200 may further include a primer layer 204 disposed above the dielectric layer 202. In certain aspects, the embedded trace substrate 200 may have one or more traces 206A, 206B, 206C (collectively referred to herein as "traces 206") partially buried in the primer layer 204. For example, the traces 206 may be partially buried in the primer layer 204 by being mechanically pressed into the primer layer. The traces 206 may comprise copper (Cu), platinum (Pt), silver (Ag), gold (Au), aluminum (Al), or any other suitable material.

In certain aspects, each of the traces 206 may be partially buried (e.g., implanted) in the primer layer to a depth. For example, trace 206A may be partially buried in the primer layer 204 to a depth 208A. Similarly, trace 206B may be partially buried in the primer layer to a depth 208B, and trace 206C may be partially buried in the primer layer to a depth 208C. The depths 208A, 208B, and 208C may be collectively referred to herein as "depths 208." The depths 208 may be equal, or at least some of the depths 208 may vary in whatever combination of implanted depths may be suitable. For example, each of the traces 206 may be partially buried into the primer layer 204 to a depth 208 of 2 to 7 μm. In certain aspects, the depth(s) 208 may be less than 2 μm, while in other aspects the depth(s) 208 may be more than 7 μm.

Figure 2B:
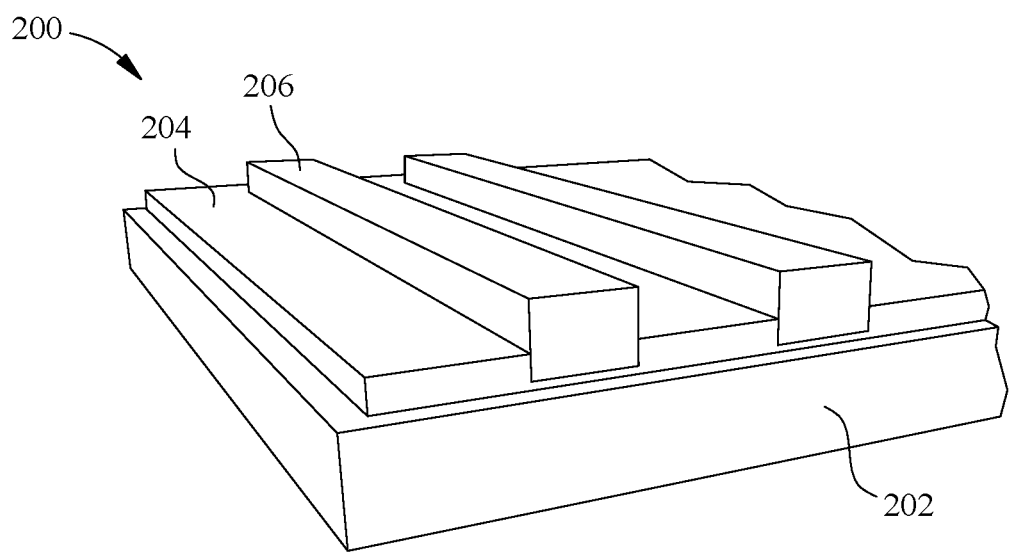

FIG. 2B depicts a partial isometric view of the example embedded trace substrate 200, in accordance with certain aspects of the present disclosure. In certain aspects, the primer layer 204 may not cover an entire surface (e.g., top) of the dielectric layer 202 (e.g., the topmost dielectric layer of the embedded trace substrate 200). Alternatively, the primer layer 204 may cover the entire top of the dielectric layer 202, at least other than trenches for conductive pads.

Figure 3A:
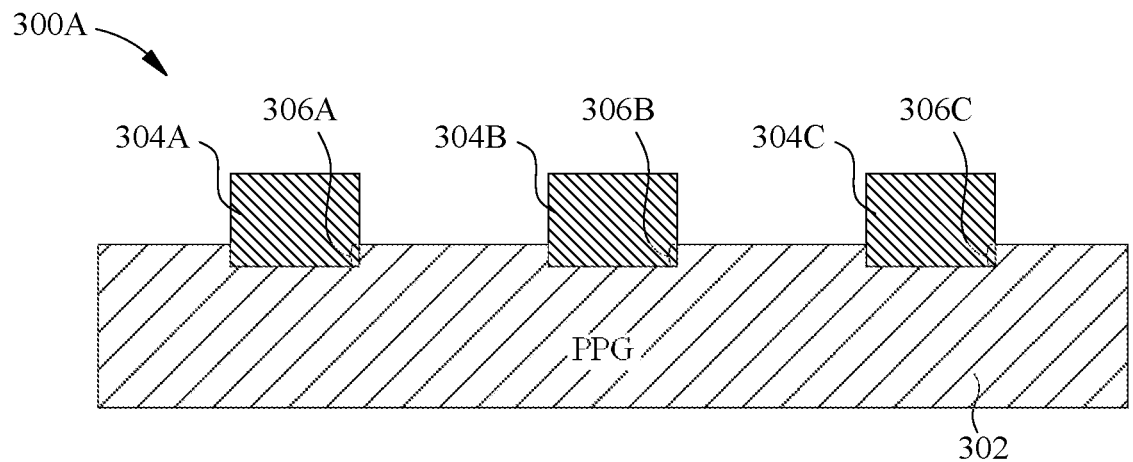
FIGS. 3A and 3B depict various views of example embedded trace substrates with partially buried traces, but without a primer layer, in accordance with certain aspects of the present disclosure.

FIG. 3A depicts a cross-sectional view of an example embedded trace substrate 300A, in accordance with certain aspects of the present disclosure. In certain aspects, the embedded trace substrate 300A may include a dielectric layer 302. The dielectric layer 302 may comprise a dielectric material such as prepreg. However, unlike the embedded trace substrate 200 of FIGS. 2A and 2B, the embedded trace substrate 300A of FIG. 3A does not include a primer layer. Rather, the embedded trace substrate 300A may have one or more traces 304A, 304B, and 304C (collectively referred to herein as "traces 304") partially buried in the dielectric layer 302. For example, the traces 304 may be partially buried in the dielectric layer 302 by being mechanically pressed into the dielectric layer 302. The traces 304 may comprise copper, platinum, silver, gold, aluminum, or any other suitable material.

In certain aspects, each of the traces 304 may be partially buried (e.g., implanted) in the dielectric layer 302 to a depth. For example, trace 304A may be partially buried in the dielectric layer 302 to a depth 306A. Similarly, trace 304B may be partially buried in the dielectric layer 302 to a depth 306B, and trace 304C may be partially buried in the dielectric layer 302 to a depth 306C. The depths 306A, 306B, and 306C may be collectively referred to herein as "depths 306." The depths 306 may be equal, or at least some of the depths 306 may vary in whatever combination of implanted depths may be suitable. For example, each of the traces 304 may be partially buried in the dielectric layer 302 to a depth 306 of 2 to 7 μm. In certain aspects, the depth(s) 306 may be less than 2 μm, while in other aspects the depth(s) 306 may be more than 7 μm.

Figure 3B:
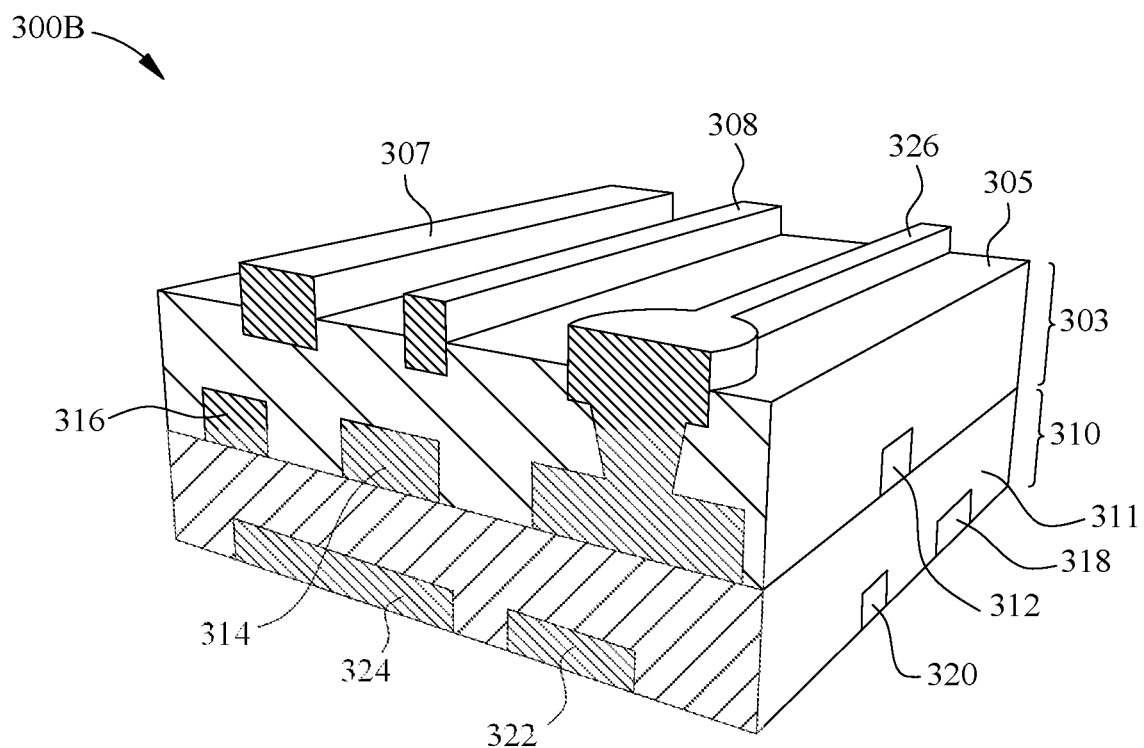

FIG. 3B depicts an isometric view of an example embedded trace substrate 300B, in accordance with certain aspects of the present disclosure. The embedded trace substrate 300B may be similar in construction to the embedded trace substrate 300A of FIG. 3A. However, the view of the embedded trace substrate 300B in FIG. 3B depicts multiple dielectric and metal layers arranged in multiple laminate layers. For example, the embedded trace substrate 300B may include a lower laminate layer 310 and an upper laminate layer 303. Within the lower laminate layer 310 may be a dielectric layer 311 and buried traces 318, 320, 322, and 324. The upper laminate layer 303 may include a dielectric layer 305 and both fully buried traces and partially buried traces. For example, in the upper laminate layer 303, traces 312, 314, and 316 may be fully buried and form a metal layer at a lower surface of the dielectric layer 305, while traces 307, 308, and 326 may be partially buried at an upper surface of the dielectric layer 305 to form another metal layer. For certain aspects, the laminate layers 303, 310 may comprise .Ajinomoto build-up film (ABF).

Example Fabrication Processes

Figure 4A:
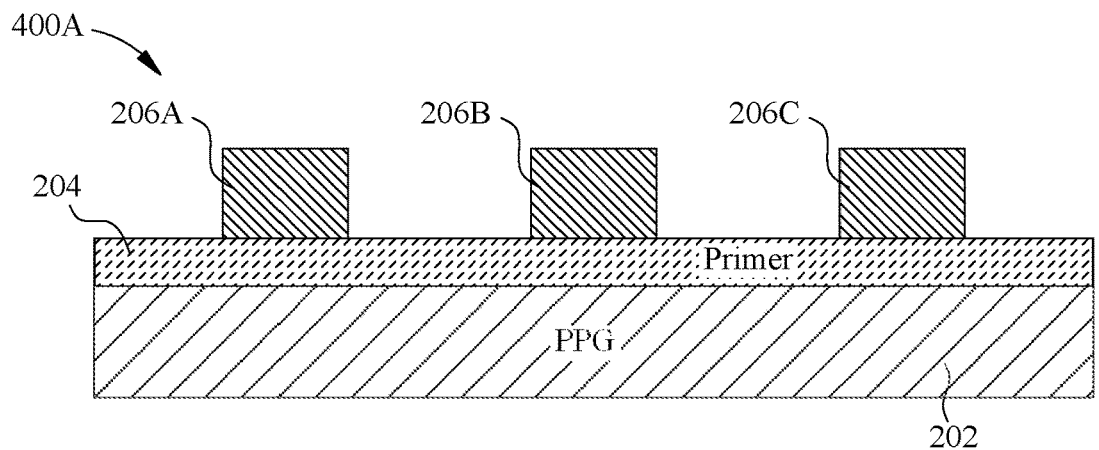
FIGS. 4A-4C are cross-sectional views of an example process for fabricating an embedded trace substrate with traces partially buried in a primer layer, in accordance with certain aspects of the present disclosure.

FIG. 4A is a cross-sectional view 400A of an exemplary fabrication operation of an embedded trace substrate (e.g., the embedded trace substrate 200), in accordance with certain aspects of the present disclosure. As shown, the dielectric layer 202 may be formed with the primer layer 204 disposed above the dielectric layer 202. In certain aspects, the primer layer 204 may not be fully cured at the stage depicted in FIG. 4A. Fabrication of the embedded trace substrate may continue by disposing at least one of the traces 206 above the primer layer 204. At the stage depicted, the traces 206 may be disposed entirely above the primer layer 204, but may be resting on the upper surface of the primer layer.

Figure 4B:
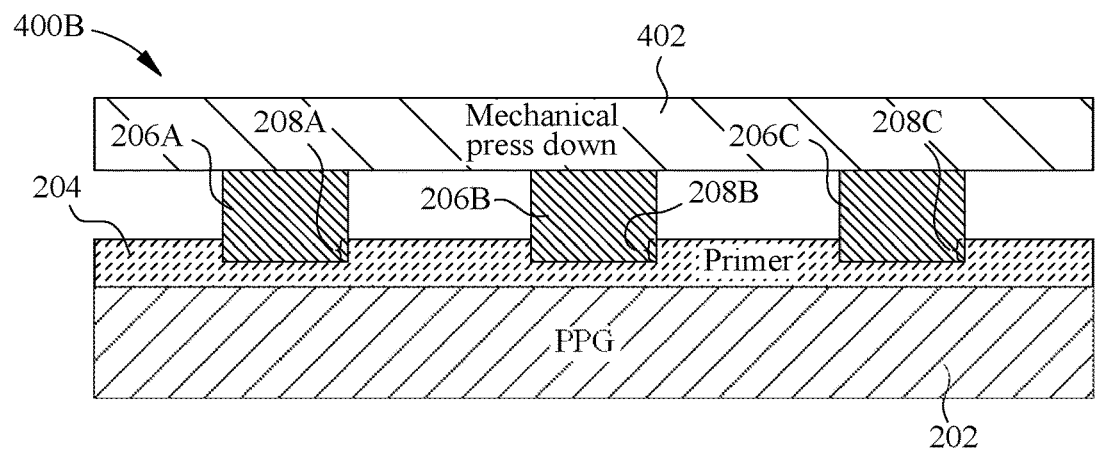

In a subsequent exemplary operation depicted in the cross-sectional view 400B of FIG. 4B, the traces 206 may be mechanically pressed down (e.g., by a plate 402 of a mechanical press or other object) to partially bury (e.g., implant) each of the traces 206 into the primer layer 204 to the depths 208. During the mechanical pressing, the primer layer 204 may be partially cured. In certain aspects, the plate 402 may be shaped such that the depths 208 are substantially equal. Alternatively, the plate 402 may be shaped such that at least some of the depths 208 may vary. For example, the portion of the plate 402 in contact with the trace 206A may have a different thickness compared to another portion of the plate 402 in contact with the trace 206C. The difference in thickness may cause the traces 206A and 206C to be partially buried to depths such that the depth 208A is not equal to the depth 208C.

Figure 4C:
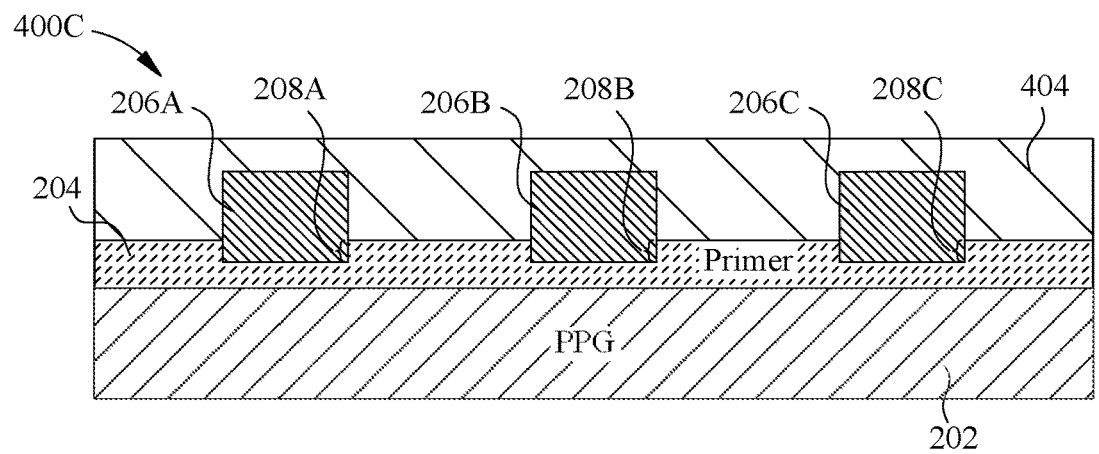

In another subsequent exemplary operation depicted in the cross-sectional view 400C of FIG. 4C, an insulative material 404 may be formed above the primer layer 204 and the partially buried traces 206. The insulative material 404 may comprise solder resist, for example, such as the solder resist 108 or 116 of FIG. 1. In certain aspects, the insulative material 404 may be formed after the primer layer 204 has fully cured. In other aspects, the insulative material 404 may be formed before the primer layer 204 has fully cured. In still other aspects, the insulative material 404 may be partially formed before the primer layer 204 has fully cured, and fully formed after the primer layer 204 has fully cured. By forming the insulative material 404 after the primer layer 204 is fully cured, the traces 206 may be less subject to lateral forces and less likely to peel than traces 206 of an embedded trace substrate 200 in which the insulative material 404 is formed before the primer layer 204 has fully cured.

Figure 5A:
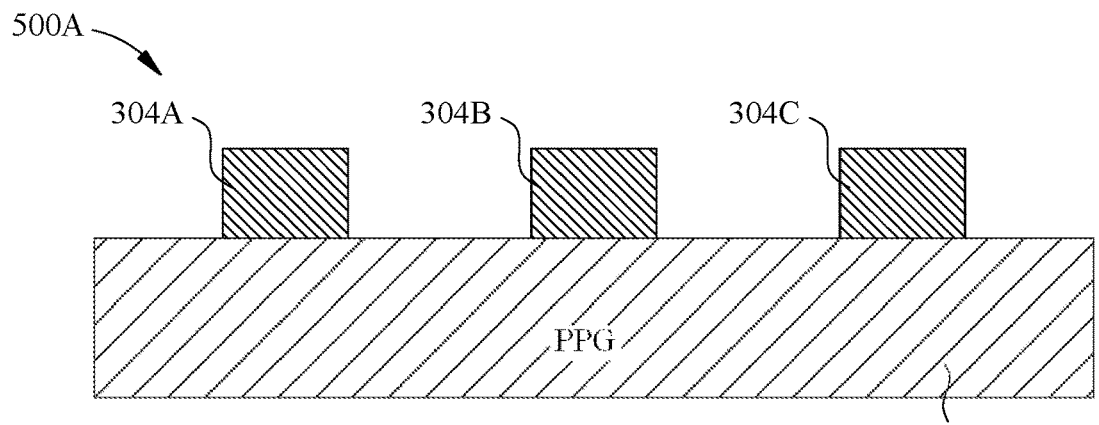
FIGS. 5A-5C are cross-sectional views of an example process for fabricating an embedded trace substrate without a primer layer and with partially buried traces, in accordance with certain aspects of the present disclosure.

FIG. 5A is a cross-sectional view 500A of an exemplary fabrication operation of an embedded trace substrate (e.g., the embedded trace substrate 300A), in accordance with certain aspects of the present disclosure. As shown, the dielectric layer 302 may be formed without a primer layer disposed thereabove. Fabrication of the embedded trace substrate may continue by disposing at least one of the traces 304 above the dielectric layer 302. At the stage depicted, the traces 304 may be disposed entirely above of the dielectric layer 302, such as resting on an upper surface of the dielectric layer.

Figure 5B:
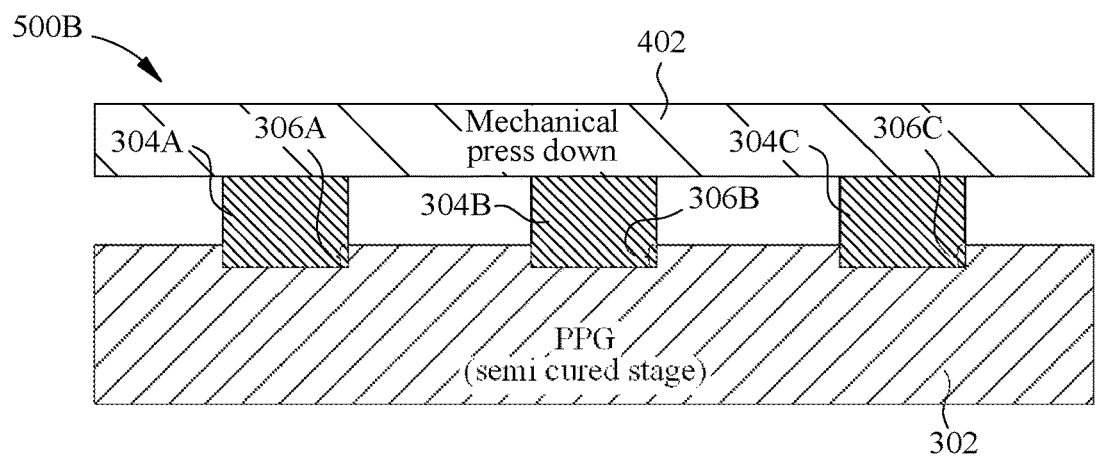

In a subsequent exemplary operation depicted in the cross-sectional view 500B of FIG. 5B, the traces 304 may be mechanically pressed down (e.g., by the plate 402) to partially bury (e.g., implant) each of the traces 304 in the dielectric layer 302 to the depths 306. In certain aspects, the plate 402 may be shaped such that the depths 306 are substantially equal. Alternatively, the plate 402 may be shaped such that at least some of the depths 306 associated with various traces may be different. For example, the portion of the plate 402 in contact with the trace 304B may have a different thickness compared to another portion of the plate 402 in contact with trace 304C. The difference in thickness may cause the traces 304B and 304C to be partially buried to depths such that the depth 306B is not equal to the depth 306C.

Figure 5C:
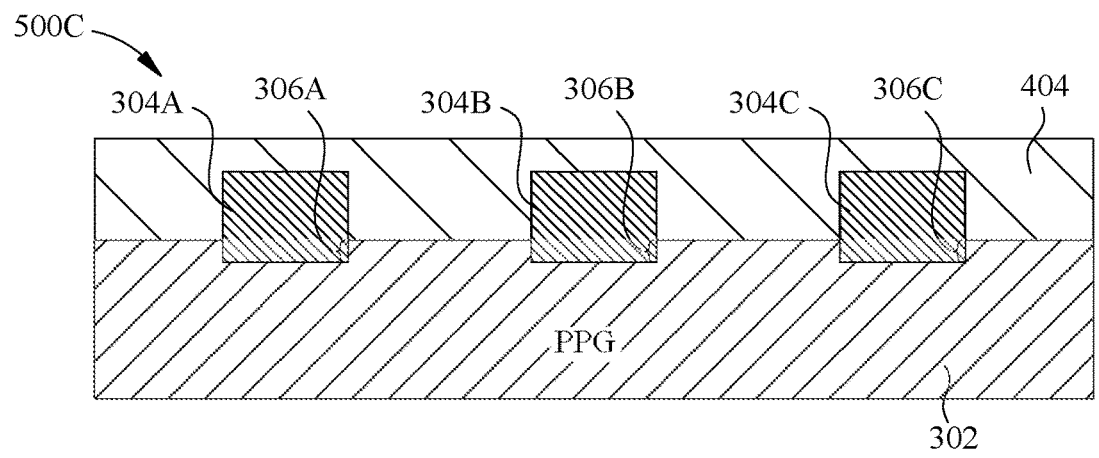

In another subsequent exemplary operation depicted in the cross-sectional view 500C of FIG. 5C, an insulative material 404 may be formed above the dielectric layer 302 and the partially buried traces 304.

Figure 6:
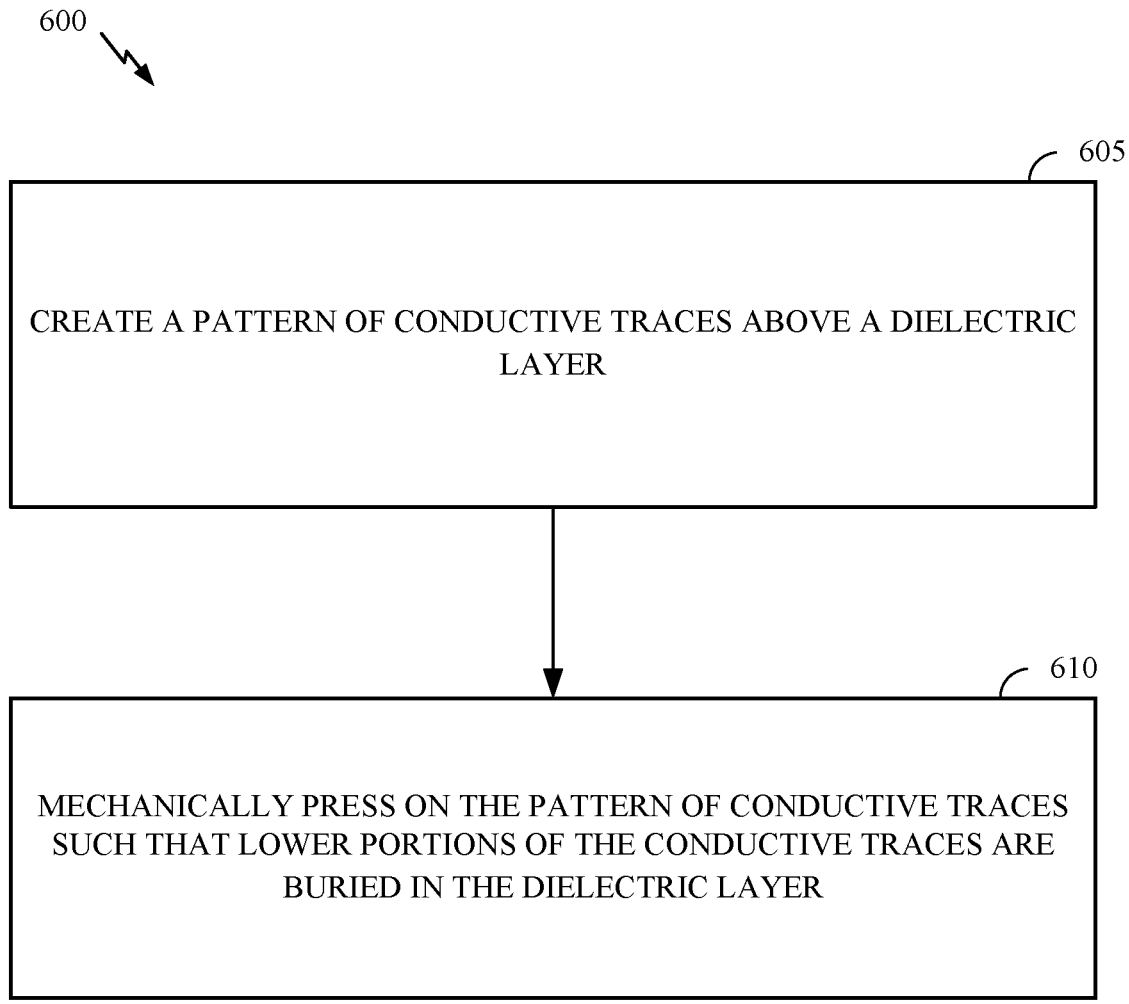
FIG. 6 is a flow diagram of example operations for fabricating an embedded trace substrate, in accordance with certain aspects of the present disclosure.

FIG. 6 is a flow diagram of example operations 600 for fabricating an embedded trace substrate (e.g. the embedded trace substrate 200 depicted in FIG. 2A or the embedded trace substrate 300A portrayed in FIG. 3A), in accordance with certain aspects of the present disclosure. The operations 600 may be performed by a semiconductor fabrication facility (also referred to as a foundry), for example.

The operations 600 may begin at block 605 by creating a pattern of conductive traces (e.g., the traces 206 or the traces 304) above a dielectric layer (e.g., the dielectric layer 302 or the dielectric layer 202 plus the primer layer 204). The dielectric layer may be formed before the pattern of conductive traces is created.

At block 610, the operations 600 may continue by mechanically pressing on the pattern of conductive traces such that lower portions of the conductive traces are buried in the dielectric layer (e.g., as shown in FIG. 4B or FIG. 5B). In other words, the conductive traces may be partially buried (i.e., not fully buried) in the dielectric layer.

In certain aspects, the dielectric layer is partially cured during the mechanically pressing of block 610. For example, the dielectric layer being partially cured may allow the conductive traces to become partially embedded in the dielectric layer, but may provide some structural stability such that the traces do not shift while the dielectric layer is curing. In other aspects, the operations 600 may further include curing the dielectric layer after the lower portions of the conductive traces are buried in the dielectric layer.

In certain aspects, the dielectric layer comprises Ajinomoto build-up film (ABF).

In certain aspects, the dielectric layer comprises a primer layer (e.g., the primer layer 204). Additionally, the operations 600 may further include forming the primer layer above at least a portion of another dielectric layer (e.g., the dielectric layer 202) before creating the pattern of conductive traces. In certain aspects, the other dielectric layer comprises a pre-impregnated (prepreg) material.

In certain aspects, the lower portions of the conductive traces are buried in the dielectric layer to a depth (e.g., depths 208) between 2 and 7 μm inclusive.

In certain aspects, the pattern of conductive traces resides in a first metal layer (e.g., the M1 layer 131) of the embedded trace substrate. In certain aspects, the operations 600 may further include forming a second metal layer below the dielectric layer (e.g., the M2 layer 132). In this case, the operations 600 may further include forming another dielectric layer (e.g., the dielectric layer 142) below the second metal layer.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An embedded trace substrate comprising:
   a first dielectric layer;
   a primer layer disposed above the first dielectric layer; and a pattern of conductive traces, wherein lower portions of the conductive traces are buried in the primer layer, wherein upper portions of the conductive traces are exposed above the first dielectric layer and the primer layer, wherein the pattern of conductive traces comprises a first trace buried at a first depth and a second trace buried at a second depth, and wherein the first depth and the second depth are different.

2. The embedded trace substrate of claim 1, wherein the first dielectric layer further comprises Ajinomoto build-up film (ABF).

3. The embedded trace substrate of claim 1, wherein the embedded trace substrate further comprises a second dielectric layer disposed below the primer layer.

4. The embedded trace substrate of claim 3, wherein at least one of the first dielectric layer or the second dielectric layer comprises a pre-impregnated (prepreg) material.

5. The embedded trace substrate of claim 1, wherein the lower portions of the conductive traces are buried in the primer layer to a depth between 2 and 7 µm inclusive.

6. The embedded trace substrate of claim 1, wherein the pattern of conductive traces is disposed in a first metal layer.

7. The embedded trace substrate of claim 6, further comprising:
a second metal layer disposed below the first dielectric layer; and
a second dielectric layer disposed below the second metal layer.

8. The embedded trace substrate of claim 7, further comprising:
a first solder resist layer disposed above the first metal layer; and
a second solder resist layer disposed below the second metal layer.

9. The embedded trace substrate of claim 1, further comprising:
an insulative layer disposed over the primer layer and the pattern of conductive traces.

10. The embedded trace substrate of claim 9, wherein the insulative layer comprises solder resist.

11. A packaged assembly comprising:
an embedded trace substrate comprising:
a first dielectric layer;
a primer layer disposed above the first dielectric layer;
a pattern of conductive traces, wherein lower portions of the conductive traces are buried in the primer layer, wherein upper portions of the conductive traces are exposed above the first dielectric layer and the primer layer, wherein the pattern of conductive traces comprises a first trace buried at a first depth and a second trace buried at a second depth, and wherein the first depth and the second depth are different; and
an integrated circuit die disposed above the embedded trace substrate and having one or more conductive terminals coupled to the upper portions of the conductive traces.

12. The packaged assembly of claim 11, wherein the lower portions of the conductive traces are buried in the primer layer to a depth between 2 and 7 µm inclusive.

13. The packaged assembly of claim 11, wherein the embedded trace substrate further comprises a second dielectric layer disposed below the primer layer.

14. The packaged assembly of claim 13, wherein at least one of the first dielectric layer or the second dielectric layer comprises a pre-impregnated (prepreg) material.

15. The packaged assembly of claim 11, wherein the first dielectric layer further comprises Ajinomoto build-up film (ABF).

16. The packaged assembly of claim 11, wherein the pattern of conductive traces is disposed in a first metal layer.

17. The packaged assembly of claim 16, further comprising:
a second metal layer disposed below the first dielectric layer; and
a second dielectric layer disposed below the second metal layer.

18. The packaged assembly of claim 17, further comprising:
a first solder resist layer disposed above the first metal layer; and
a second solder resist layer disposed below the second metal layer.

19. The packaged assembly of claim 11, wherein the embedded trace substrate further comprises:
an insulative layer disposed over the primer layer and the pattern of conductive traces.

20. The packaged assembly of claim 19, wherein the insulative layer comprises solder resist.

* * * * *